US011821948B2

(12) United States Patent
Weigell et al.

(10) Patent No.: US 11,821,948 B2
(45) Date of Patent: Nov. 21, 2023

(54) MEASUREMENT SYSTEM AND METHOD OF MEASURING A DEVICE UNDER TEST

(71) Applicant: Rohde & Schwarz GmbH & Co. KG, Munich (DE)

(72) Inventors: Philipp Weigell, Munich (DE); Sascha Kunisch, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 560 days.

(21) Appl. No.: 17/097,120

(22) Filed: Nov. 13, 2020

(65) Prior Publication Data

US 2022/0155369 A1    May 19, 2022

(51) Int. Cl.
*H01H 31/02* (2006.01)
*G01R 31/319* (2006.01)
(Continued)

(52) U.S. Cl.
CPC ... *G01R 31/31907* (2013.01); *G01R 1/06788* (2013.01); *G01R 31/31924* (2013.01);
(Continued)

(58) Field of Classification Search
CPC ........ G01R 31/31907; G01R 31/31924; G01R 31/3193; G01R 31/52; G01R 31/58;
(Continued)

(56) References Cited

U.S. PATENT DOCUMENTS

2008/0189060 A1* 8/2008 Zellner ............ G01R 31/31907
702/58
2009/0113260 A1* 4/2009 Teng ................ G01R 31/31907
714/724
(Continued)

*Primary Examiner* — Raul J Rios Russo
(74) *Attorney, Agent, or Firm* — CHRISTENSEN O'CONNOR JOHNSON KINDNESS PLLC (57) ABSTRACT

A measurement system for measuring a device under test is described. The measurement system includes a control and analysis module composed of one or more circuits, a stimulus module composed of one or more circuits, and a measurement interface composed of ,for example, one or more circuits. The stimulus module is configured to generate an electric stimulus signal based on predefined measurement parameters. The measurement system is configured to be connected to a device under test via the measurement interface. The measurement interface is configured to forward the electric stimulus signal from the stimulus module to the device under test. The measurement interface further is configured to forward a response signal from the device under test to the control and analysis module, wherein the response signal corresponds to a response of the device under test to the stimulus signal. The control and analysis module is configured to analyze the response signal, thereby generating a set of analysis data. The control and analysis module is further configured to compare the set of analysis data generated with a database. The database includes several measurement data sets being associated with different classes or types of devices under test. The control and analysis module is further configured to adapt the predefined measurement parameters of the stimulus module based on the comparison of the set of analysis data with the database. Further, a method of measuring a device under test is described.

20 Claims, 3 Drawing Sheets

(51) Int. Cl.
  *G01R 31/52* (2020.01)
  *G01R 31/58* (2020.01)
  *G01R 1/067* (2006.01)
  *H01L 21/66* (2006.01)
(52) U.S. Cl.
  CPC .............. *G01R 31/52* (2020.01); *G01R 31/58* (2020.01); *H01L 22/14* (2013.01); *H01L 2924/00* (2013.01); *H01L 2924/0002* (2013.01)
(58) Field of Classification Search
  CPC ............ G01R 1/06788; H01L 2924/00; H01L 2924/0002; H01L 22/14
  USPC ................................................. 324/500, 555
  See application file for complete search history.

(56) References Cited

U.S. PATENT DOCUMENTS

2010/0013511 A1  1/2010  Li
2021/0311118 A1* 10/2021 Podolski ............ G01R 31/3191

* cited by examiner

MEASUREMENT SYSTEM AND METHOD OF MEASURING A DEVICE UNDER TEST

FIELD OF THE DISCLOSURE

Embodiments of the present disclosure generally relate to a measurement system for measuring a device under test. Embodiments of the present disclosure further relate to a method of measuring a device under test.

BACKGROUND

With increasing complexity of electronic devices, the tolerance requirements on the individual electronic components of these electronic devices become ever more restrictive.

Thus, the individual electronic components may have to be tested individually and/or in combination with each other in order to ensure a correct functionality of the electronic device under test.

However, different individual electronic components may require different settings of a measurement instrument being used for testing the electronic device under test. Thus, the user conducting the tests must have a considerable amount of knowledge about the individual electronic components and the respectively required measurement settings.

Accordingly, there is a need for a measurement system as well as a method of measuring a device under test that allow for an easier testing of electronic devices under test.

SUMMARY

Embodiments of the present disclosure provide a measurement system for measuring a device under test. In an embodiment, the measurement system comprises a control and analysis module composed of one or more circuits, a stimulus module composed of one or more circuits, and a measurement interface. The stimulus module is configured to generate an electric stimulus signal based on predefined measurement parameters. The measurement system is configured to be connected to a device under test via the measurement interface. The measurement interface is configured to forward the electric stimulus signal from the stimulus module to the device under test. The measurement interface further is configured to forward a response signal from the device under test to the control and analysis module, wherein the response signal corresponds to a response of the device under test to the stimulus signal. The control and analysis module is configured to analyze the response signal, thereby generating a set of analysis data. The control and analysis module further is configured to compare the set of analysis data generated with a database. The database comprises several measurement data sets being associated with different classes or types of devices under test. The control and analysis module further is configured to adapt the predefined measurement parameters of the stimulus module based on the comparison of the set of analysis data with the database.

Therein and in the following, the term "device under test" may relate to an electronic device that is to be tested or to an electronic component of an electronic device that is to be tested.

The measurement system according to the present disclosure is based on the idea to automatically identify the device under test and the measurement parameters needed for testing the device under test by analyzing the response of the device under test to a predefined signal, namely the response of the device under test to the electric stimulus signal.

More precisely, the response of the device under test to the electric stimulus signal is compared with a database comprising typical responses of different classes or types of devices under test in order to identify the class or type of the device under test.

Therein, the "class or type" of the device under test may be associated with a specific class of electronic components, a specific type of electronic components, a specific series of electronic components, and/or a specific model of electronic components.

The electrical stimulus signal is generated based on the predefined measurement parameters, which may comprise one or more of the following parameters: at least one frequency of the electric stimulus signal, at least one amplitude of the electric stimulus signal, at least one phase of the electric stimulus signal, a root mean square (RMS) of the electric stimulus signal, and/or at least one waveform shape of the electric stimulus signal, e.g. a sawtooth-shape, a sine-like shape, or a rectangular shape.

Based on the comparison of the response of the device under test to the database of different responses of different classes or types of devices under test, the class and/or type of the device under test may be automatically identified and the correct measurement parameters for testing the device under test may be set automatically.

For example, the set of analysis data may be compared with the database by determining a respective difference between the set of analysis data and the measurement data sets. The determined difference may be evaluated in order to determine a probability that the device under test corresponds to the respective class or type.

In other words, the measurement system according to the present disclosure is a self-calibrating measurement system, as it automatically identifies the class or type of the device under test being connected to the measurement system, and automatically sets the correct measurement parameters being associated with that particular device under test.

Setting the correct measurement parameters may require two or more iterations. Thus, the stimulus module may generate a second electric stimulus signal based on the adapted predefined measurement parameters, and the response of the device under test to the second electric stimulus signal may be analyzed analogously to the procedure described above with respect to the electric stimulus signal. This procedure may be repeated until the class and/or type of the device under test is correctly identified and thus the correct measurement parameters for testing the device under test are set.

The database may be stored in a local memory of the measurement system. Alternatively or additionally, the database may be stored in an external memory, for example on one or several servers, to which the measurement system may be connected, for example via the Internet.

The control and analysis module, the stimulus module, and/or the measurement interface may be integrated into a single measurement device.

In some embodiments, the control and analysis module, the stimulus module, and/or the measurement interface may be integrated into an LCR meter.

Alternatively, the control and analysis module, the stimulus module, and/or the measurement interface may be established separately from one another.

According to an aspect of the present disclosure, the database comprises measurement parameters being associated with the different classes or types of devices under test.

Thus, the database may comprise the correct settings, i.e. the correct measurement parameters for each of the several different classes or types of devices under test. Thus, the predefined measurement parameters of the stimulus module may be adapted based on the measurement parameters that are stored in the database.

According to another aspect of the present disclosure, the control and analysis module is configured to identify the measurement data set being most similar to the set of analysis data in order to adapt the measurement parameters. More precisely, the control and analysis module may identify the measurement data set being most similar to the set of analysis data based on the comparison of the set of analysis data with the database. In general, the measurement data set being most similar to the set of analysis data has the highest probability of being associated with the correct measurement parameters. Thus, the measurement parameters may be adapted based on the measurement parameters being associated with the measurement data set that is most similar to the set of analysis data.

In an embodiment of the present disclosure, the stimulus signal is established as an AC signal comprising at least one predefined frequency. Accordingly, AC properties of the device under test can be tested of the measurement system. In some embodiments, the predefined measurement parameters comprise the at least one predefined frequency.

In a further embodiment of the present disclosure, the stimulus signal comprises a first frequency in a first time interval and a second frequency in a second time interval, wherein the first frequency is different from the second frequency. Thus, properties of the device under test being associated with different input frequencies can be tested by the measurement system. In some embodiments, the stimulus signal may comprise several different frequencies in several different time intervals.

For example, the measurement system may be configured to measure a frequency response of the device under test, i.e. a response of the device under test to electric stimulus signals having several different frequencies.

According to another aspect of the present disclosure, the set of analysis data comprises a frequency response of the device under test. Thus, the frequency response of the device under test may be compared with other frequency responses being stored in the databased in order to identify the class and/or the type of the device under test. For example, different classes of electronic components like resistances, inductances and capacitances have distinctly different frequency responses and thus can be identified based on the frequency response.

In some embodiments, the stimulus signal comprises a first voltage level in a first time interval and a second voltage level in a second time interval, wherein the first voltage level is different from the second voltage level. Thus, properties of the device under test being associated with different voltage levels may be determined by the measurement system. For example, properties like a linearity or a non-linearity of the device under test with respect to input voltage may be tested.

Therein and in the following, the term "voltage level" may denote a root mean square of a voltage amplitude of the electric stimulus signal, for example if the electric stimulus signal is established as an AC signal.

The stimulus signal may comprise a first current level in a first time interval and a second current level in a second time interval, wherein the first current level is different from the second current level. Thus, properties of the device under test being associated with different current levels may be determined by the measurement system. For example, properties like a linearity or a non-linearity of the device under test with respect to input current may be tested.

Therein and in the following, the term "current level" may denote a root mean square of a current amplitude of the electric stimulus signal, for example if the electric stimulus signal is established as an AC signal.

In a further embodiment of the present disclosure, the stimulus signal is established as a pretest signal or as a measurement signal.

Therein and in the following, the term "pretest signal" is understood to denote an electric stimulus signal that is used in order to identify the class and/or the type of the device under test. In other words, the pretest signal is an electric stimulus signal that is used before the actual testing of the device under test is started.

The term "measurement signal" is understood to denote an electric stimulus signal that is used for the actual testing of the device under test, i.e. after the correct measurement parameters are set.

According to an aspect of the present disclosure, the measurement system comprises a measuring bridge. In some embodiments, the measurement system may comprise an LCR meter. For example, the measurement system may be established as an LCR meter.

Embodiments of the present disclosure further provide a method of measuring a device under test. In an embodiment, the method comprises the following steps:

generating a first electric stimulus signal based on predefined measurement parameters by a stimulus module, the first stimulus signal being established as a pretest signal;

forwarding the first stimulus signal to a device under test, thereby obtaining a response signal, wherein the response signal corresponds to a response of the device under test to the first stimulus signal;

analyzing the response signal by a control and analysis module, thereby obtaining a set of analysis data;

comparing the set of analysis data with a database, the database comprising several measurement data sets being associated with different classes or types of devices under test; and adapting the predefined measurement parameters of the stimulus module based on the comparison of the set of analysis data with the database.

In some embodiments, one or more embodiments of the measurement system described above is configured to perform the method of measuring a device under test.

Regarding the advantages and further properties of the method, reference is made to the explanations given above with respect to the measurement system, which also hold for the method and vice versa.

According to an aspect of the present disclosure, a second electric stimulus signal is generated based on the adapted measurement parameters. Setting the correct measurement parameters may require two or more iterations. Thus, the stimulus module may generate a second electric stimulus signal based on the adapted predefined measurement parameters, and the response of the device under test to the second electric stimulus signal may be analyzed analogously to the procedure described above with respect to the electric stimulus signal. This procedure may be repeated until the class and/or type of the device under test is correctly identified and thus the correct measurement parameters for testing the device under test are set.

According to another aspect of the present disclosure, the second electric stimulus signal is established as a pretest signal or as a measurement signal. The pretest signal is an electric stimulus signal that is used in order to identify the class and/or the type of the device under test. In other words, the pretest signal is an electric stimulus signal that is used before the actual testing of the device under test is started. The measurement signal is an electric stimulus signal that is used for the actual testing of the device under test, i.e. after the correct measurement parameters are set.

In an embodiment of the present disclosure, the measurement data set being most similar to the set of analysis data is identified in order to adapt the measurement parameters. More precisely, the measurement data set being most similar to the set of analysis data may be identified based on the comparison of the set of analysis data with the database. In general, the measurement data set being most similar to the set of analysis data has the highest probability of being associated with the correct measurement parameters. Thus, the measurement parameters may be adapted based on the measurement parameters being associated with the measurement data set that is most similar to the set of analysis data.

In a further embodiment of the present disclosure, the database comprises measurement parameters being associated with the different classes or types of devices under test. Thus, the database may comprise the correct settings, i.e. the correct measurement parameters for each of the several different classes or types of devices under test. Thus, the predefined measurement parameters of the stimulus module may be adapted based on the measurement parameters that are stored in the database.

The stimulus signal may be established as an AC signal comprising at least one predefined frequency. Accordingly, AC properties of the device under test can be tested by the method according to the present disclosure. In some embodiments, the predefined measurement parameters comprise the at least one predefined frequency.

In some embodiments, the first stimulus signal comprises a first frequency in a first time interval and a second frequency in a second time interval, wherein the first frequency is different from the second frequency. Thus, properties of the device under test being associated with different input frequencies can be tested by the method according to the present disclosure. In some embodiments, the stimulus signal may comprise several different frequencies in several different time intervals.

For example, a frequency response of the device under test, i.e. a response of the device under test to electric stimulus signals having several different frequencies may be measured.

In a further embodiment of the present disclosure, the first stimulus signal comprises a first voltage level in a first time interval and a second voltage level in a second time interval, wherein the first voltage level is different from the second voltage level. Thus, properties of the device under test being associated with different voltage levels may be determined by the method according to the present disclosure. For example, properties like a linearity or a non-linearity of the device under test with respect to input voltage may be tested.

According to an aspect of the present disclosure, the first stimulus signal comprises a first current level in a first time interval and a second current level in a second time interval, wherein the first current level is different from the second current level. Thus, properties of the device under test being associated with different current levels may be determined by the method according to the present disclosure. For example, properties like a linearity or a non-linearity of the device under test with respect to input current may be tested.

According to another aspect of the present disclosure, the set of analysis data comprises a frequency response of the device under test. Thus, the frequency response of the device under test may be compared with other frequency responses being stored in the databased in order to identify the class and/or the type of the device under test. For example, different classes of electronic components like resistances, inductances and capacitances have distinctly different frequency responses and thus can be identified based on the frequency response.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
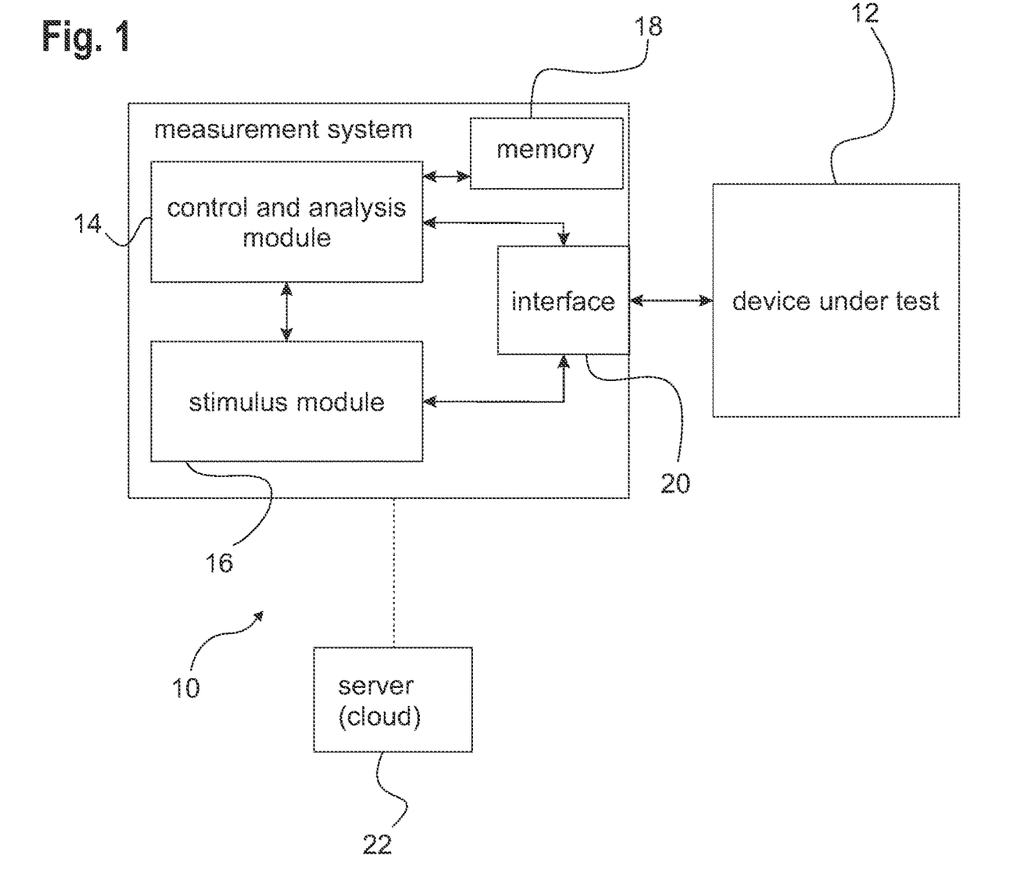
FIG. 1 schematically shows a measurement system according to an embodiment of the present disclosure.

FIG. 1 schematically shows a measurement system 10 being connected to an electronic device under test 12. Generally, the device under test 12 may be a single electronic component that is to be tested, such as an inductance, a capacitance, a resistance, a diode, a transistor, etc. However, the device under test 12 may also comprise several electronic components that are to be tested, and that may be connected to each other.

The measurement system 10 comprises a control and an analysis module 14, a stimulus module 16, a memory 18, and a measurement interface 20. The functionality of the individual components of the measurement system 10 will be described in more detail below.

In some embodiments, the term "module" refers to a combination of hardware (e.g. a processor such as an integrated circuit or other circuitry) and software (e.g. machine- or processor-executable instructions, commands, or code such as firmware, programming, or object code). Furthermore, a combination of hardware and software may include hardware only (i.e. a hardware element with no software elements), software hosted at hardware (e.g. software that is stored at a memory and executed or interpreted at a processor), or hardware with the software hosted thereon. In some embodiments, the hardware may, inter alia, comprise a CPU, a GPU, an FPGA, an ASIC, or other types of electronic circuitry.

Optionally, the measurement system 10 may be connected to a server 22 in a signal transmitting manner, for example to several servers 22 forming a cloud. Therein and in the following, the term "connected in a signal transmitting manner" is understood to denote a cable-based or wireless connection that is configured to transmit signals between the respective devices or components. For example, the measurement system 10 may be connected to the server(s) 22 via the Internet.

Generally speaking, the measurement system 10 is configured to identify a class and/or a type of the device under test 12, and to set measurement parameters for testing the device under test 12 automatically. For example, the measurement system 10 may be established as a self-calibrating measuring bridge, for example as a self-calibrating LCR meter.

More precisely, the measurement system 10 is configured to perform a method for measuring the device under test 12, which is described in the following example with reference to FIG. 2.

A first electric stimulus signal is generated by the stimulus module 16 based on predefined measurement parameters (step S1).

The first electric stimulus signal is established as a pretest signal. This means that the predefined measurement parameters being associated with the first electric stimulus signal may not be the correct ones for actually testing that particular device under test 12.

Instead, the first electric stimulus signal corresponds to a standard signal that is used in order to identify the device under test 12, and in order to obtain the correct measurement parameters for testing that particular device under test 12.

The predetermined measurement parameters may comprise one or more of the following parameters: at least one frequency of the first electric stimulus signal, at least one amplitude of the electric stimulus signal, at least one phase of the first electric stimulus signal, a root mean square (RMS) of the first electric stimulus signal, and/or at least one waveform shape of the first electric stimulus signal, e.g. a sawtooth-shape, a sine-like shape, or a rectangular shape.

The first electric stimulus signal may be established as an AC signal comprising at least one predefined frequency.

In some embodiments, the first electric stimulus signal may comprise a first frequency in a first time interval and a second frequency in a second time interval, wherein the first frequency and the second frequency are different from each other.

The number of different frequencies of the electric stimulus signal is not limited to two. Instead, the first electric stimulus signal may comprise a series of different frequencies in different time intervals.

Moreover, the first stimulus signal may comprise a first voltage level in a first time interval and a second voltage level in a second time interval, wherein the first voltage level is different from the second voltage level.

Therein and in the following, the term "voltage level" may denote a root mean square of a voltage amplitude of the first electric stimulus signal, for example if the first electric stimulus signal is established as an AC signal.

The number of different voltage levels of the first electric stimulus signal is not limited to two. Instead, the first electric stimulus signal may comprise a series of different voltage levels in different time intervals.

Alternatively or additionally, the first stimulus signal may comprise a first (electric) current level in a first time interval and a second (electric) current level in a second time interval, wherein the first current level is different from the second current level.

Therein and in the following, the term "current level" may denote a root mean square of a current amplitude of the first electric stimulus signal, for example if the first electric stimulus signal is established as an AC signal.

The number of different current levels of the first electric stimulus signal is not limited to two. Instead, the first electric stimulus signal may comprise a series of different current levels in different time intervals.

The first electric stimulus signal is forwarded to the device under test 12, thereby obtaining a response signal (step S2).

The response signal may correspond to a reflection of the first electric stimulus signal at an input of the device under test 12.

Alternatively or additionally, the response signal may correspond to a processed version of the first electric stimulus signal, i.e. to an output signal of the device under test 12 that is generated by the device under test 12 based on the first electric stimulus signal.

The response signal of the device under test 12 is forwarded to the control and an analysis module 14 by the measurement interface 20 (step S3).

The control and analysis module 14 analyzes the response signal of the device under test 12, thereby obtaining a set of analysis data (step S4).

Generally, the set of analysis data comprises information on certain properties of the response signal of the device under test 12. For example, the set of analysis data may comprise information on frequencies of the response signal, amplitudes of the response signal, and/or phases of the response signal.

For example, the set of analysis data may comprise a frequency response of the device under test 12, which is determined based on the analysis of the response signal.

The determined set of analysis data is compared with a database that is stored in the memory 18 and/or on the server(s) 22 in order to identify a class and/or a type of the device under test 12 (step S5).

Figure 3:
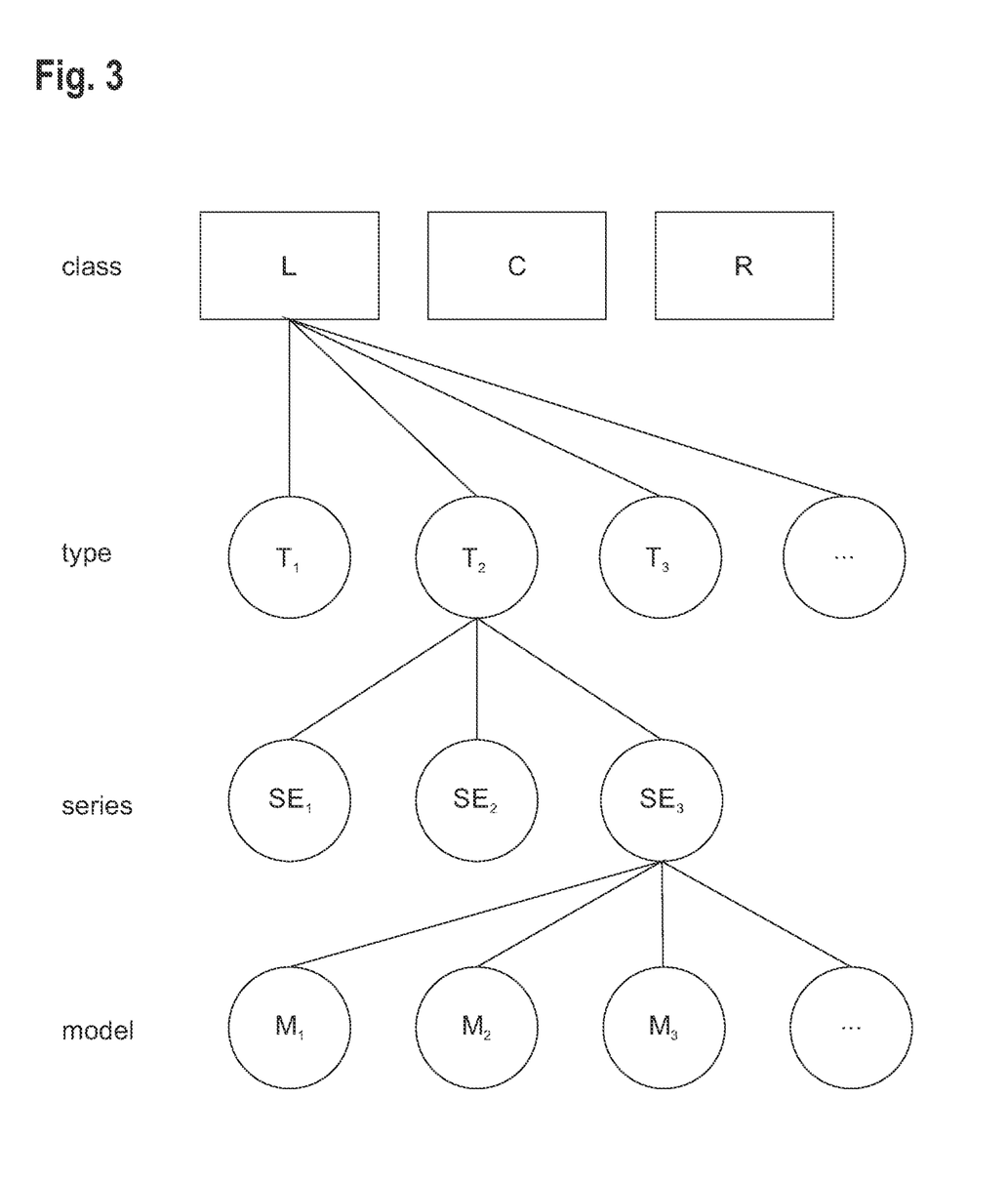
FIG. 3 shows a diagram illustrating a classification step of the method of FIG. 2.

As is illustrated in FIG. 3, the "class or type" of the device under test 12 may be associated with a specific class of electronic components (L, C, R), a specific type of electronic components ($T_1$, $T_2$, etc.), a specific series of electronic components ($SE_1$, $SE_2$, etc.), and/or a specific model of electronic components ($M_1$, $M_2$, etc.).

For example, the class of the device under test 12 may relate to whether the device under test 12 is established as an inductance L, as a capacitance C, or as a resistance R.

In general, the database comprises several measurement data sets that are associated with different classes and/or with different types of devices under test. In other words, the database comprises the respective (analyzed) responses of several different classes or types of devices under test to the first electric stimulus signal.

By implication, the class and/or the type of the device under test 12 can be determined by comparing the set of analysis data with the database of measurement data sets. For example, the set of analysis data may be compared with the database by determining a respective difference between the set of analysis data and the measurement data sets.

The determined difference may be evaluated in order to determine a probability that the device under test 12 corresponds to the respective class or type. For example, if the determined difference between the set of analysis data and a particular measurement data set is lower than a predetermined difference threshold, the device under test 12 may be identified to belong to the class and/or type being associated with that measurement data set.

The predefined measurement parameters of the stimulus module 16 are adapted by the control and analysis module 14 based on the comparison of the set of analysis data with the database (step S6).

The adapted measurement parameters may already correspond to the correct measurement parameters for testing the device under test 12. For example, the correct measurement parameters for the individual classes and/or types of devices under test may be stored in the database in the memory 18 and/or on the server(s) 22.

However, setting the correct measurement parameters may require two or more iterations. Thus, as indicated by the dashed arrow in FIG. 2, the stimulus module 16 may generate a second electric stimulus signal based on the adapted predefined measurement parameters, and the response of the device under test 12 to the second electric stimulus signal may be analyzed analogously to the steps S1 to S5 described above.

This procedure may be repeated until the class and/or type of the device under test 12 is correctly identified and thus the correct measurement parameters for testing the device under test 12 are set.

When the correct measurement parameters for testing the device under test 12 are set, the stimulus module may generate a further electric stimulus signal based on these measurement parameters, and the device under test 12 may be tested based on that further electric stimulus signal (step S7).

Summarizing, the measurement system 10 described above is a self-calibrating measurement system, which automatically identifies the class and/or type of the device under test 12 being connected to the measurement system 10, and automatically sets the correct measurement parameters being associated with that particular device under test 12.

Figure 2:
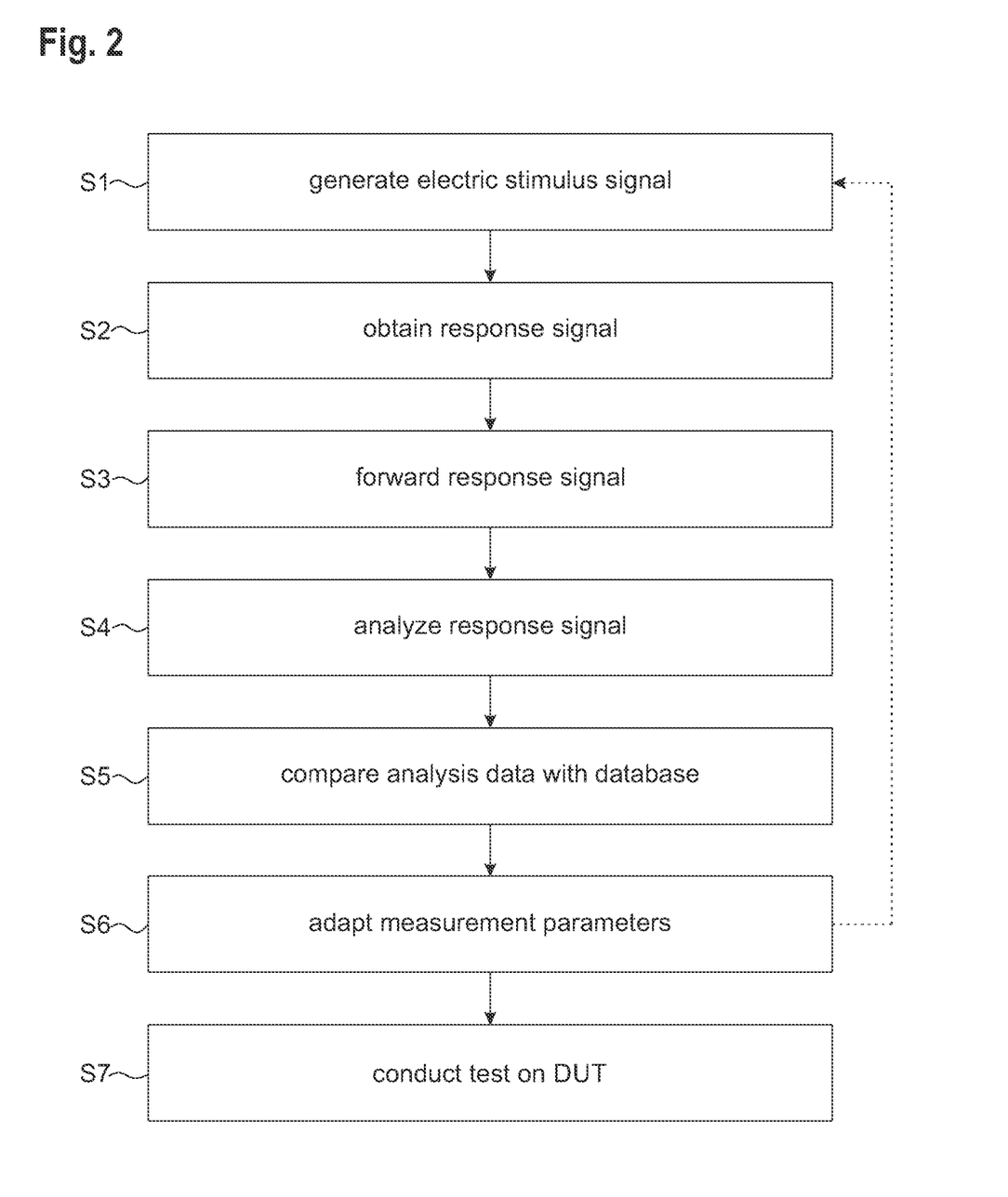
FIG. 2 shows a flow chart of a method according to an embodiment of the present disclosure.

Thus, no knowledge about the class and/or type of the device under test 12 is required from a user of the measurement system 10, as the device under test 12 is automatically identified and the correct measurement parameters are automatically set The measurement system 10 or one or more components thereof, is configured to perform one or more steps schematically shown, for example, in FIG. 2. In some embodiments, one or more of these components includes one or more computer-readable media containing computer readable instructions embodied thereon that, when executed by one or more computer circuits (contained in or associated with the measurement device 10 or components thereof), cause the one or more computer circuits to perform one or more steps of the method of FIG. 2 described above. In some embodiments, the one or more computer circuits, sometimes referred to as computing devices, includes a microprocessor, a microcontroller, a central processing unit, a graphics processing unit (GPU), a digital signal processor (DSP), an application specific integrated circuit (ASIC), etc. Of course, special purpose hardware-based computer systems or circuits can be also employed to perform one or more steps of the method of FIG. 2 described above.

In some embodiments, the one or more computer-readable media contains computer readable instructions embodied thereon that, when executed by the one or more computer circuits, cause the one or more computer circuits to perform one or more steps of any of the methods of claims 11-20.

Certain embodiments disclosed herein, for example the respective module(s), unit(s), etc., utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

In some examples, the functionality described herein can be implemented by special purpose hardware-based computer systems or circuits, etc., or combinations of special purpose hardware and computer instructions.

Of course, in some embodiments, two or more of these components, or parts thereof, can be integrated or share hardware and/or software, circuitry, etc. In some embodiments, these components, or parts thereof, may be grouped in a single location or distributed over a wide area. In circumstances were the components are distributed, the components are accessible to each other via communication links.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A measurement system for measuring a device under test, the measurement system comprising a control and analysis circuit, a stimulus circuit, and a measurement interface,
   the stimulus circuit being configured to generate an electric stimulus signal based on predefined measurement parameters,
   the measurement system being configured to be connected to a device under test via the measurement interface,
   the measurement interface being configured to:
      forward the electric stimulus signal from the stimulus circuit to the device under test; and
      forward a response signal from the device under test to the control and analysis circuit, wherein the response signal corresponds to a response of the device under test to the stimulus signal,
   the control and analysis circuit being configured to:
      analyze the response signal, thereby generating a set of analysis data,
      compare the set of analysis data generated with a database, the database comprising several measurement data sets being associated with different classes or types of devices under test, and
      adapt the predefined measurement parameters of the stimulus circuit based on the comparison of the set of analysis data with the database.

2. The measurement system of claim 1, wherein the database comprises measurement parameters being associated with the different classes or types of devices under test.

3. The measurement system of claim 1, wherein the control and analysis circuit is configured to identify the measurement data set being most similar to the set of analysis data in order to adapt the measurement parameters.

4. The measurement system of claim 1, wherein the stimulus signal is established as an AC signal comprising at least one predefined frequency.

5. The measurement system of claim 4, wherein the stimulus signal comprises a first frequency in a first time interval and a second frequency in a second time interval, wherein the first frequency is different from the second frequency.

6. The measurement system of claim 1, wherein the set of analysis data comprises a frequency response of the device under test.

7. The measurement system of claim 1, wherein the stimulus signal comprises a first voltage level in a first time interval and a second voltage level in a second time interval, wherein the first voltage level is different from the second voltage level.

8. The measurement system of claim 1, wherein the stimulus signal comprises a first current level in a first time interval and a second current level in a second time interval, wherein the first current level is different from the second current level.

9. The measurement system of claim 1, wherein the stimulus signal is established as a pretest signal or as a measurement signal.

10. The measurement system of claim 1, wherein the measurement system comprises a measuring bridge.

11. A method of measuring a device under test, comprising:
   generating a first electric stimulus signal based on predefined measurement parameters by a stimulus circuit, the first stimulus signal being established as a pretest signal;
   forwarding the first stimulus signal to a device under test, thereby obtaining a response signal, wherein the response signal corresponds to a response of the device under test to the first stimulus signal;
   analyzing the response signal by a control and analysis circuit, thereby obtaining a set of analysis data;
   comparing the set of analysis data with a database, the database comprising several measurement data sets being associated with different classes or types of devices under test; and
   adapting the predefined measurement parameters of the stimulus circuit based on the comparison of the set of analysis data with the database.

12. The method of claim 11, wherein a second electric stimulus signal is generated based on the adapted measurement parameters.

13. The method of claim 12, wherein the second electric stimulus signal is established as a pretest signal or as a measurement signal.

14. The method of claim 11, wherein the measurement data set being most similar to the set of analysis data is identified in order to adapt the measurement parameters.

15. The method of claim 11, wherein the database comprises measurement parameters being associated with the different classes or types of devices under test.

16. The method of claim 11, wherein the stimulus signal is established as an AC signal comprising at least one predefined frequency.

17. The method of claim 16, wherein the first stimulus signal comprises a first frequency in a first time interval and a second frequency in a second time interval, wherein the first frequency is different from the second frequency.

18. The method of claim 11, wherein the first stimulus signal comprises a first voltage level in a first time interval and a second voltage level in a second time interval, wherein the first voltage level is different from the second voltage level.

19. The method of claim 11, wherein the first stimulus signal comprises a first current level in a first time interval and a second current level in a second time interval, wherein the first current level is different from the second current level.

20. The method of claim 11, wherein the set of analysis data comprises a frequency response of the device under test.

* * * * *